US008581175B2

(12) United States Patent
Heidler et al.

(10) Patent No.: US 8,581,175 B2
(45) Date of Patent: Nov. 12, 2013

(54) DEVICE FOR CONVERTING LIGHT INTO AN ELECTRICAL SIGNAL

(75) Inventors: Christian Heidler, Hohenschaeftlarn (DE); Rainer M. Kossat, Aschau (DE); Bert Zamzow, Stockdorf (DE)

(73) Assignee: CCS Technology, Inc., Wilmington, DE (US)

( * ) Notice: Subject to any disclaimer, the term of this patent is extended or adjusted under 35 U.S.C. 154(b) by 0 days.

(21) Appl. No.: 13/209,948

(22) Filed: Aug. 15, 2011

(65) Prior Publication Data

US 2012/0138780 A1 Jun. 7, 2012

Related U.S. Application Data

(63) Continuation of application No. PCT/EP2010/051319, filed on Feb. 3, 2010.

(51) Int. Cl.
*G01J 1/04* (2006.01)
*G02B 6/42* (2006.01)

(52) U.S. Cl.
USPC .................................................... 250/227.21

(58) Field of Classification Search
USPC ................... 250/227.21, 227.11; 385/101, 32
See application file for complete search history.

(56) References Cited

U.S. PATENT DOCUMENTS

| 1,525,985 A | 2/1925 | Feldkamp |
| 4,398,794 A | 8/1983 | Palmer et al. ............... 350/96.19 |
| 7,894,694 B2 * | 2/2011 | Gaudiana et al. ............. 385/101 |
| 2005/0137657 A1 | 6/2005 | Dykaar ........................... 607/88 |

FOREIGN PATENT DOCUMENTS

EP 0565331 A2 4/1993

OTHER PUBLICATIONS

EPO Search Report, PCT/EP2010/051319, Jul. 13, 2010, pp. 1-3.

* cited by examiner

*Primary Examiner* — Seung C Sohn

(57) ABSTRACT

A device for converting light transmitted by an optical transmission element into an electrical signal. Light is decoupled from a coiled or helically bent fiber and coupled into distributed over photovoltaic cells rather than concentrated at a small coupling location.

21 Claims, 5 Drawing Sheets

DEVICE FOR CONVERTING LIGHT INTO AN ELECTRICAL SIGNAL

PRIORITY APPLICATION

This application is a continuation of International Application No. PCT/EP10/051,319 filed Feb. 3, 2010, which claims the benefit of priority to German Application No. 202009002331, filed Feb. 18, 2009, both applications being incorporated herein by reference.

TECHNICAL FIELD

The disclosure relates to a device for converting light transmitted by an optical transmission element into an electrical signal.

BACKGROUND

Optical transmission elements, for example optical waveguides, are increasingly being used for the transmission of data. An emitting unit converts the data to be transmitted into light pulses that are fed into the transmission element at one end of the optical transmission element. The light pulses are passed via the optical transmission element to a receiving unit, for example a video camera, and are coupled out from the optical waveguide. For the power supply of the receiving unit, a supply voltage is usually required, which is fed to the receiving unit via an additional cable, for example a copper cable. If one wishes to avoid feeding a power supply through a separate cable, there is the possibility of the power necessary for operating the receiving unit also being transmitted via the optical-waveguide cable in addition to the data transmission to the receiving unit. At the receiving unit, the light has to be converted into an electrical signal in order that a supply voltage can be provided for operating the receiving unit.

It is desirable to specify a device for converting light into an electrical signal that enables the efficient conversion of light into an electrical signal.

SUMMARY

The device for converting light into an electrical signal comprises an optical transmission element for transmitting light, and a photoelectric sensor element for converting light into an electrical signal. The optical transmission element has a bent section. The optical transmission element is configured so that light transmitted in the optical transmission element is coupled out from the optical transmission element at the bent section. The photoelectric sensor element is arranged so that the light coupled out from the optical transmission element is coupled into the photoelectric sensor element. The photoelectric sensor element is configured so that the electrical signal is generated when light is coupled into the photoelectric sensor element.

The device for converting light into an electrical signal makes it possible to provide a power supply via a single optical-waveguide cable. When an optical waveguide is connected to the device for converting light into an electrical signal, light that has been coupled into the optical transmission element of the device is coupled out owing to the bend of the optical transmission element at the bent section and is coupled into the photoelectric sensor element. Depending on a level of the light coupled into the photoelectric sensor element, a voltage that can be used for example as a supply voltage for operating an optical receiving unit, for example for operating a video camera, is generated at the terminals of the photoelectric sensor element. Since the optical transmission element in the device is bent in a large-area region, the light coupled into the optical transmission element of the device is coupled out in a manner distributed over a large area region. The photoelectric sensor element can have a large photosensitive area at which the light is coupled into the sensor element. Coupling the light into a large-area photosensitive region of the photoelectric sensor element makes it possible to prevent rapid heating of the photoelectric sensor element. The efficiency in the conversion of light into an electrical signal is thus increased.

In accordance with a further embodiment of the device, the bent section of the optical transmission element is bent helically. A plurality of layers composed of in each case the bent section of the optical transmission element and the photoelectric sensor element can be arranged one above another. In the device, light coupled out from the optical transmission element can be coupled into the optical transmission element after a modulation.

In accordance with a further embodiment, the device comprises a reflector, wherein the reflector is configured so that light coupled out from the optical transmission element impinges on the reflector and is reflected onto the photoelectric sensor element.

In accordance with another embodiment of the device, the optical transmission element has a further section wherein the bent section is arranged closer to the photoelectric sensor element than the further section. The optical transmission element is configured so that more light is coupled out at the bent section than at the further section.

In accordance with another embodiment of the device, the optical transmission element is arranged on a carrier element. The carrier element can be configured in cylindrical or conical fashion. The carrier element can have a diameter of between 6 mm and 15 mm. The carrier element contains for example a material comprising plastic, metal or Plexiglas®. The optical transmission element can be arranged in a manner embedded in a protective body. The optical transmission element is arranged for example in a manner cast in a material of the protective body or is arranged in a manner encapsulated by the material of the protective body by injection-moulding. The material of the protective body can be configured in transparent fashion. The optical transmission element can comprise an optical waveguide. The optical waveguide can have an inner region and an outer region and a layer of nanostructures can be arranged between the inner and outer regions. In accordance with a further embodiment, the optical waveguide has an inner region and an outer region and cavities containing a gas are arranged between the inner and outer regions. In another embodiment, the optical waveguide has an inner region and an outer region and a material of the inner region and a material of the outer region can in each case have different refractive indexes. The inner and outer regions can contain a material comprising glass or plastic.

In accordance with a further embodiment of the device, the photosensitive sensor element comprises a terminal for providing a voltage. The photoelectric sensor element is configured so that when light is coupled into the photoelectric sensor element, at the terminal, a level of the voltage is provided in a manner dependent on a light intensity of the light coupled in. The photoelectric sensor element can be arranged circumferentially around the optical transmission element. The photoelectric sensor element can comprise a flexible film having a light-sensitive material. The light-sensitive material can contain silicon or gallium arsenide. The film can be configured as a crystalline photovoltaic film or a thin-film photovoltaic film. The photoelectric sensor element can comprise at least one photosensitive component, in particular a photodiode, wherein the photosensitive component is arranged on a printed circuit board. The printed circuit board can comprise at least one light-emitting component. The printed circuit board can comprise a component for processing a signal generated by the at least one photosensitive component when light is coupled in, and for controlling the light-emitting components. The photosensitive sensor element can be configured as an outer coating of the optical waveguide.

A method for converting light into an electrical signal is specified below. In accordance with the method, an optical transmission element for transmitting light and a photoelectric sensor element for converting light into an electrical signal are provided. A section of the optical transmission element is bent. Light is coupled into the optical transmission element. Light is coupled out from the bent section of the optical transmission element. Light is coupled into the photoelectric sensor element. The electrical signal is generated by the photoelectric sensor element. In accordance with a further embodiment of the method, the provision of the photoelectric sensor element having a terminal for generating a voltage is provided. When the light is coupled into the photoelectric sensor element, a level of a voltage is generated in a manner dependent on the light intensity of the light coupled in.

In accordance with another embodiment of the method, the bent section of the optical transmission element is bent helically. The bent section of the optical transmission element can be arranged on a carrier element. The bent section of the optical transmission element can be embedded into a material.

In accordance with a further embodiment of the method, the photoelectric sensor element can be arranged circumferentially around the bent section of the optical transmission element. Furthermore, a layer composed of further bent sections of a further optical transmission element and of a further photoelectric sensor element can be arranged around the photoelectric sensor element.

In a further embodiment, the provision of the optical transmission element configured as an optical waveguide, wherein the optical waveguide has an inner region and an outer region arranged around the inner region, is provided. For the transmission of data, light is coupled into the inner region of the optical waveguide. Light provided for conversion into the electrical signal is coupled into the outer region of the optical waveguide. The light serving for the transmission of data can be coupled into the optical waveguide at an end face of the inner region of the optical waveguide. Light serving for conversion into the electrical signal can be coupled into the optical waveguide by the bent section of the optical waveguide being tangentially irradiated with the light.

In accordance with a further embodiment of the method, the light for the transmission of data can be coupled out from the optical waveguide. The light coupled out can be modulated. The modulated light is coupled into the optical waveguide.

The embodiments are explained in more detail below with reference to figures showing exemplary embodiments of the present invention.

DETAILED DESCRIPTION

Figure 1:
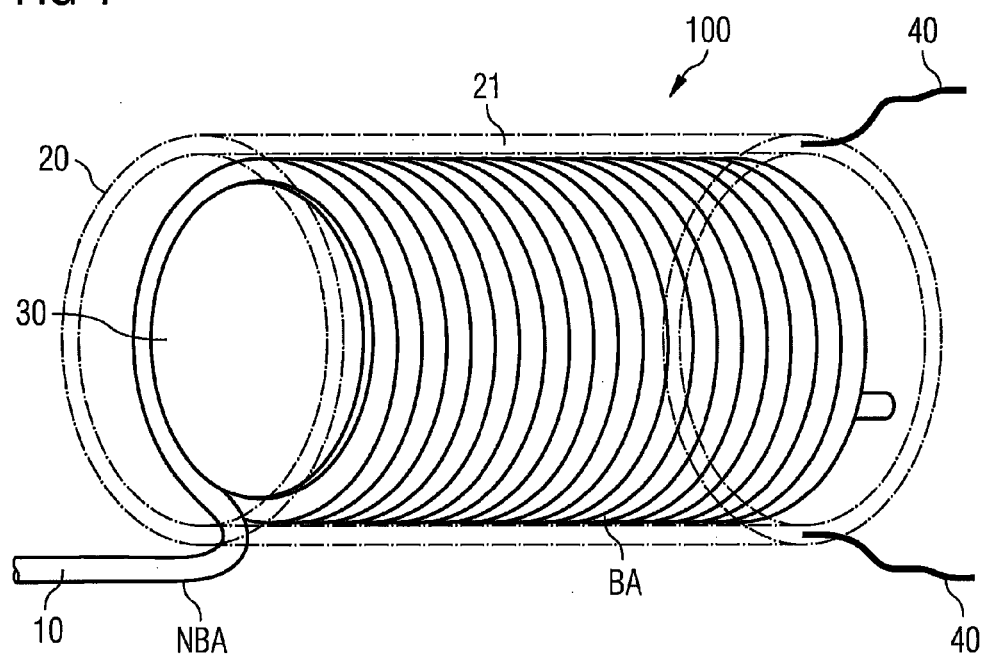
FIG. 1 shows one embodiment of a device for converting light into an electrical signal.

FIG. 1 shows one embodiment of a device 100 for converting light into an electrical signal. The device comprises an optical transmission element 10, for example an optical waveguide. The optical transmission element has a plurality of bends. In the embodiment shown in FIG. 1, the optical transmission element 10 is bent for example helically in a plurality of turns.

The optical transmission element is surrounded by a photoelectric sensor element 20. The photoelectric sensor element is configured so that an electrical signal is generated by the photoelectric sensor element when light is coupled in. The electrical signal can be a voltage. For providing the electrical signal, for example an electrical voltage, the photoelectric sensor element has terminals 40.

For operating the device, light is coupled into the optical waveguide 10. The light is firstly guided in the optical transmission element in an unbent section NBA of the optical transmission element. At those locations at which the optical transmission element has a bend, a portion of the light emerges from the optical transmission element. The proportion of the light which is coupled out from the optical transmission element is dependent in particular on the bending radius with which the optical transmission element is bent. The optical transmission element can be bent in a bending radius of between 3 mm and 10 mm. The narrower the bending radius is chosen to be, the higher the proportion of the light which emerges from the optical transmission element at the bent section. In the embodiment shown in FIG. 1, the optical transmission element can be bent in turns having a diameter of between 6 mm and 15 mm, for example.

As a result of the bending of the optical waveguide in the section BA, a portion of the light is coupled out from the optical transmission element at each turn. Since the bending radius or the diameter of the turns is uniform over the entire length of the bent section, an identical proportion of the light transmitted into the optical transmission element is coupled out in each turn. The light coupled out impinges on the photoelectric sensor 20, which surrounds the optical transmission element 10 in the bent section BA. When light is coupled into the photoelectric sensor element 20, an electrical signal is generated at the terminals 40.

In order that the light emerges from the optical transmission element 10 in a manner as free of losses as possible in the bent section BA, the optical transmission element can have a coating having low absorption. This ensures that as little energy as possible is converted into heat when the light is coupled out from the optical transmission element 10. The absorption of the coating should be low in particular in a wavelength range of between 800 nm and 850 nm, which is provided for example for transmitting the light into the optical waveguide 10. The optical transmission element can be configured so that the absorption of the light is lower in particular in the bent section of the optical transmission element, said section being arranged close to the photoelectric sensor element 20, than at the section NBA that has no bend or is further away from the photoelectric sensor element.

Particularly low losses occur with the use of an optical transmission element having a transparent coating. The coating should be transparent in particular in the wavelength range provided for transmitting the light in the optical transmission element. By way of example, the optical transmission element can be configured so that the optical transmission element is transparent for example to light having a wavelength of between 800 nm and 850 nm.

In order to minimize losses that arise after the light has been coupled out from the optical transmission element 10 and before the light has been coupled into the photoelectric sensor element 20, the photoelectric sensor element is arranged as close as possible to the bent section BA of the optical transmission element 10. The photoelectric sensor element 20 can, for example, in the region of the bent section BA, bear against the material of the optical transmission element 10 or be at a distance of between 0.5 mm and 3 mm from the optical transmission element 10.

The photoelectric sensor element 20 can be configured as a flexible film. By way of example, a crystalline photovoltaic film or a thin-film photovoltaic film can be used for energy conversion. For efficient generation of electrical energy, the photoelectric sensor element 20 comprises a material composed of silicon or gallium arsenide. If the optical transmission element is an optical waveguide, in accordance with a further possible embodiment the photoelectric sensor element 20 can be configured as a coating of an optical waveguide 10. In this embodiment, the light-guiding part of the optical transmission element 10 is surrounded by a coating having a photoelectric effect. As a result, the light coupled out from the light-guiding part of the optical waveguide 10 owing to the bending is coupled directly into the coating. On account of the photovoltaic effect, the energy of the light coupled in is converted into an electrical signal in the photoelectric sensor element. Consequently, an electrical voltage, for example, can be tapped off at a surface of the coating of the optical waveguide 10.

The optical transmission element 10 can be an optical waveguide configured with a coating or without a coating. If the optical waveguide 10 is surrounded by a coating, it can have a diameter of 250 μm, for example. If an optical waveguide without a coating is used, the external diameter can be 125 μm, for example. Glass fibres or plastic fibres can be used as materials for the optical transmission element 10. With the use of a POF fibre (Plastic Optical Fibre), the external diameter of the optical waveguide can be approximately 1 mm.

For supporting the bent arrangement of the optical transmission element, a carrier element 30 can be provided, around which the optical transmission element 10 is arranged helically in a plurality of turns. The carrier element 30 can be configured in cylindrical fashion, for example. Transparent materials such as Plexiglas®, for example, can be used as materials for the carrier element. The carrier element can also be produced from a metal or plastic. The diameter of the carrier element or the diameter of the helical arrangement of the optical transmission element 10 is chosen in a manner dependent on the bending sensitivity of the optical transmission element 10.

Bending sensitivity should be understood to mean the ability of the optical transmission element to couple out a proportion of the light guided in the optical transmission element at a bend in a manner dependent on a bending radius. The higher the bending sensitivity of the optical transmission element, the higher the proportion of the light which can be coupled out for a specific bending radius or for a specific diameter of a bent turn of the optical transmission element. The optical transmission element can be arranged in a bending radius of between 3 mm and 10 mm. The diameter of the carrier element can be for example between 6 mm and 15 mm.

Figure 2A:
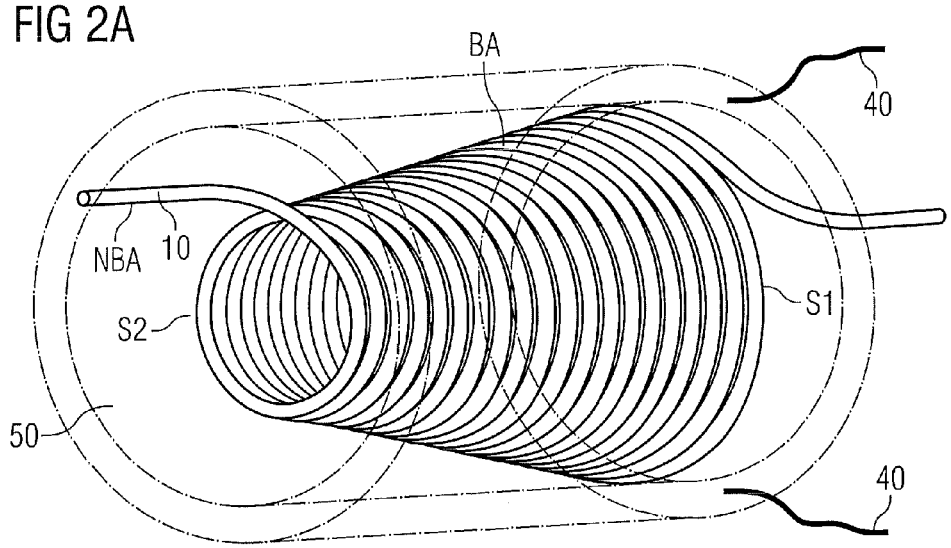
FIG. 2A shows a further embodiment of a device for converting light into an electrical signal in a perspective view.
Figure 2B:
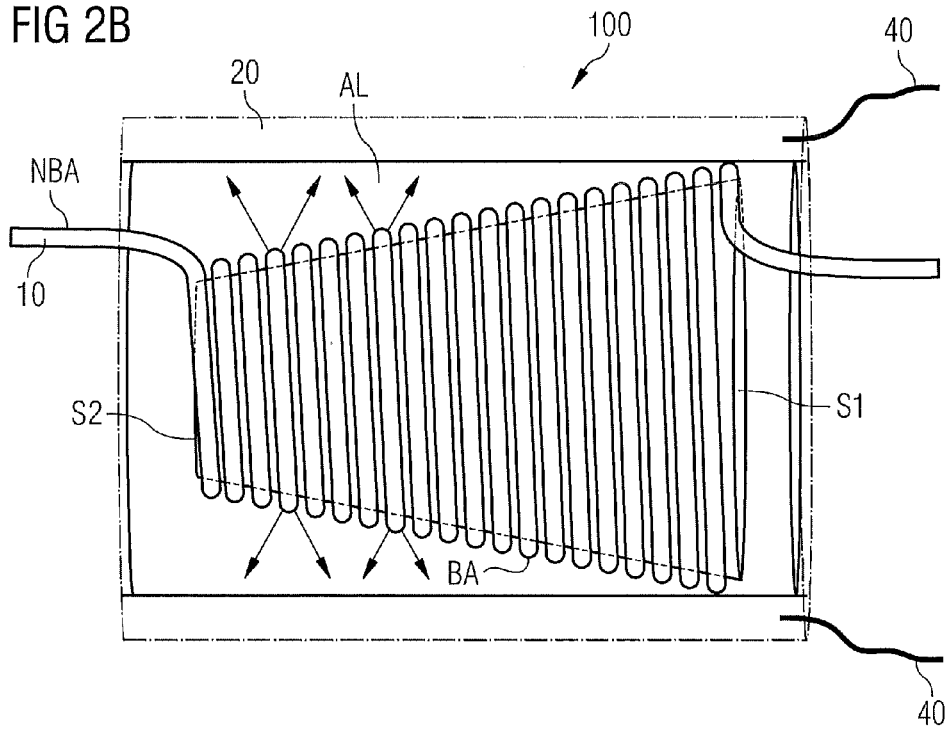
FIG. 2B shows a transverse view of the further embodiment of a device for converting light into an electrical signal.

FIG. 2A shows a perspective view and FIG. 2B shows a transverse view of a further embodiment of a device for converting light into an electrical signal. In the embodiment shown in FIGS. 2A and 2B, the same reference symbols as in FIG. 1 are used for identical elements. In the embodiment shown in FIGS. 2A and 2B, an optical transmission element 10 is bent conically in a section BA. In this case, the diameter of the turns of the optical transmission element 10 tapers from a side S1 to an oppositely arranged side S2 of the device. The optical transmission element 10 is also surrounded circumferentially by the photoelectric sensor element 20 in the embodiment shown in FIGS. 2A and 2B.

If light is guided in the optical transmission element 10, a light emergence AL arises at the bent section BA. The optical transmission element can be configured so that light with a numerical aperture of 10° emerges from the material of the transmission element 10 along the bent section BA of the optical transmission element. The light coupled out from the optical transmission element 10 is scattered onto a surface of the photoelectric sensor element 20. After the scattered light has been coupled into the photoelectric sensor element 20, an electrical voltage is generated at the terminals 40. The level of the generated voltage is dependent on the light power with which the coupled-out light impinges on the surface of the photoelectric sensor element.

In the embodiment shown in FIGS. 2A and 2B, the optical transmission element 10 can be configured as an optical waveguide having a coating having low absorption. The coating should have an absorption that is as low as possible in particular in the wavelength range of the transmitted light, for example in a waveband of between 800 nm and 850 nm. In particular, the optical waveguide can be configured so that the coating has a lower absorption in the region of the bent section BA, which is arranged close to the photoelectric sensor element 20, than at a straight section NBA of the optical transmission element, which is further away from the photoelectric sensor element. In order to keep losses very low when light is coupled out from the optical transmission element, an optical waveguide having a transparent coating can be used, for example. The coating can be transparent in particular to light having a wavelength of between 800 nm and 850 nm.

In order to limit the conversion of light energy into heat energy, it is possible to use an optical waveguide which does not have a coating in the conically bent section BA. The external diameter of an optical waveguide having a coating can be up to 250 μm. The external diameter of an optical waveguide without a coating can be 125 μm, for example. It is possible to use optical waveguides comprising glass fibres or plastic fibres. An optical waveguide comprising plastic fibres can have an external diameter of up to 1 mm diameter.

The photoelectric sensor element 20 used can be a flexible film, for example, which enables the conically bent section of the optical waveguide 10 to be surrounded circumferentially.

By way of example, a crystalline photovoltaic film or a thin-film photovoltaic film can be used. For converting light into an electrical signal, the photoelectric sensor element comprises a material composed of silicon or gallium arsenide.

In the embodiment of the device for converting light into an electrical signal as shown in FIGS. 2A and 2B, the optical transmission element 10 can be arranged at a carrier element, such as, for example, the carrier element 30 shown in FIG. 1. In contrast to the embodiment shown in FIG. 1, the carrier element in the embodiment shown in FIGS. 2A and 2B is not configured in cylindrical fashion, but rather in conical fashion. The conical bending of the optical transmission element 10 enables light to be coupled out in a manner distributed uniformly over the entire region of the bent section BA. Since the bending radius of the optical transmission element decreases from the side S1 to the side S2 and a higher proportion of the light is thus coupled out at the side S1, the light power that decreases over the entire length of the cone as a result of the light emergence can be compensated for if light is transmitted from the side S1 to the side S2. This ensures a uniform distribution of the light power over the entire bent section BA.

In the embodiments of the device for converting light into an electrical signal as shown in FIGS. 1, 2A and 2B, it is possible to embed the optical transmission element 10 into a protective body 50. The protective body 50 can contain a transparent material, for example a transparent material composed of a plastic. The optical transmission element 10 can be cast into the material of the protective body. In another embodiment, the material of the protective body is arranged in a manner injection-moulded around the optical transmission element 10.

Figure 3A:
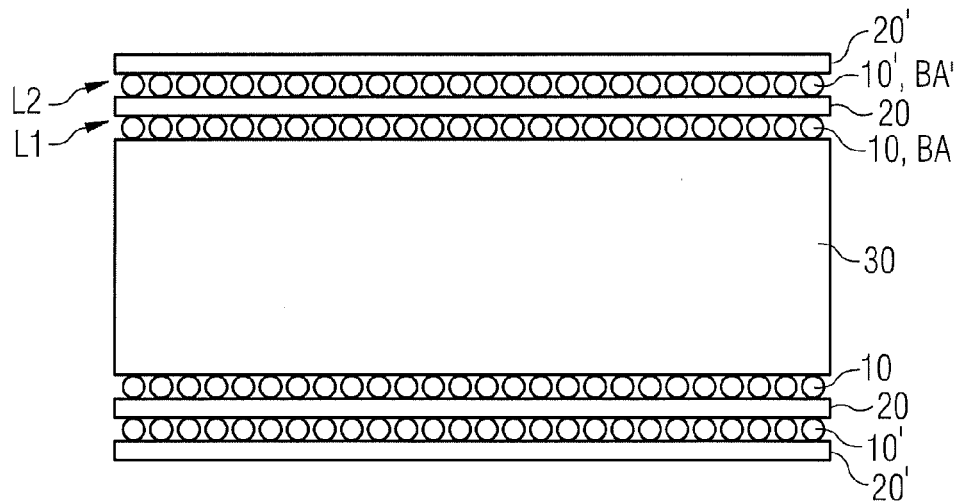
FIG. 3A shows a further embodiment of a device for converting light into an electrical signal.

FIG. 3A shows a cross section of an embodiment of a device for converting light into an electrical signal in which a plurality of layers L1, L2 composed of in each case a bent section of an optical transmission element and a photoelectric sensor element are arranged one above another. In the embodiment shown in FIG. 3A, a layer L1 comprises a bent section BA of the optical waveguide 10, around which the photoelectric sensor element 20 is arranged. A layer L2 comprises a bent section BA' of a further optical transmission element 10', around which a further photoelectric sensor element 20' is arranged. The optical transmission elements 10 and 10' are in each case arranged helically around a carrier element 30. When a flexible film is used as the photoelectric sensor element, the sensor elements 20 and 20' can be arranged circumferentially around the bent sections BA and BA', respectively, of the optical transmission element 10, 10'.

The layer arrangement increases the efficiency of the conversion of the light coupled out from the bent sections of the optical transmission elements 10 and 10' into an electrical signal. In order to improve the stability, the layers L1 and L2 can be arranged around a centrally arranged carrier element 30 or be surrounded by a transparent material, for example by a transparent plastic. In the latter embodiment, the layers L1 and L2 can be cast into the material or be encapsulated by the material by injection-moulding. In such an embodiment, the carrier body 30 can be obviated.

Figure 3B:
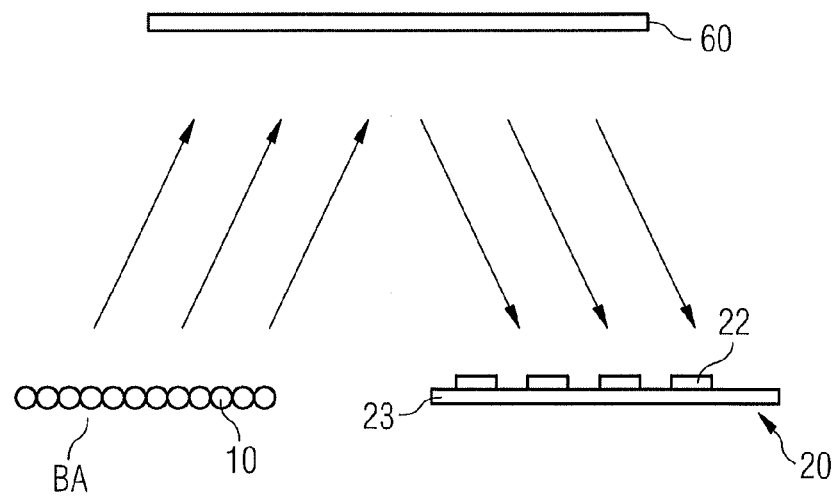
FIG. 3B shows a further embodiment of a device for converting light into an electrical signal.

FIG. 3B shows a further embodiment of the device for converting light into an electrical signal in a cross-sectional view. The optical transmission element 10 has bends in the section BA. In the case of a small bending radius, for example a bending radius of 3 mm to 10 mm, light transmitted in the optical transmission element 10 is coupled out at the bent regions BA of the optical transmission element. The light coupled out impinges on a reflector 60 and is reflected from there onto a photoelectric sensor element 20. The photoelectric sensor element 20 can be a photovoltaic film. It is also possible to provide photo elements 22 which, when light is coupled in, convert the light energy fed in into an electrical signal, for example an electrical voltage. As a result, a voltage is provided by the photosensitive components 22. The photosensitive components 22 can be arranged on a carrier material 23. The carrier material 23 can be a rigid material, for example a printed circuit board.

Figure 4:
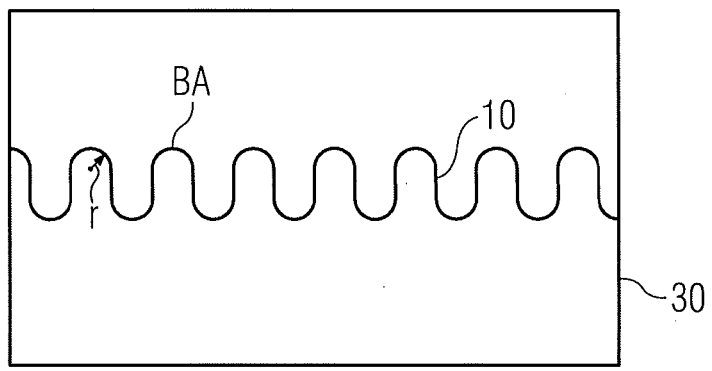
FIG. 4 shows an embodiment of an optical transmission element for coupling out light.

FIG. 4 shows an embodiment of an optical transmission element 10 having bent sections BA. The optical transmission element 10 can be an optical conductor track, for example, which is arranged on a carrier element 30. The conductor track can contain a material composed of glass or plastic that is applied on the carrier body 30. The bends BA can have a bending radius r of between 3 mm and 10 mm. Light that has been fed into the fibre-optic waveguide 10 is coupled out at the bent sections BA.

Figure 5:
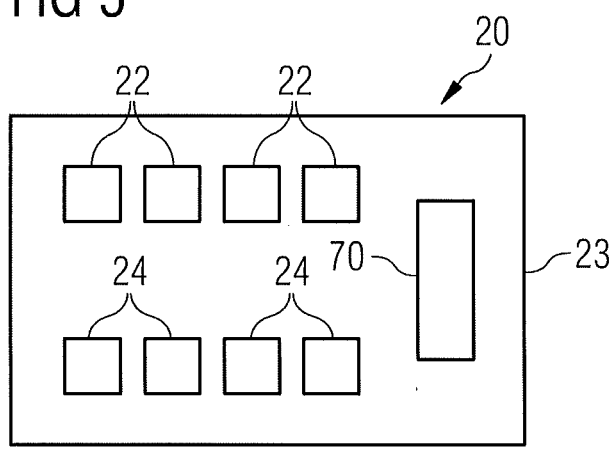
FIG. 5 shows an embodiment of a photoelectric sensor element for converting light into an electrical signal.

In the embodiment illustrated in FIG. 4, the fibre-optic waveguide 10 is arranged in one plane. A photoelectric sensor element can be arranged above the plane of the fibre-optic waveguide 10. The photoelectric sensor element can also be arranged in the same plane as the fibre-optic waveguide 10 if for example a reflector element is arranged above the plane in which the fibre-optic waveguide 10 is situated. Consequently, light coupled out at the bent sections BA can be coupled into a photoelectric sensor element after reflection at the reflector element FIG. 5 shows an embodiment of the photoelectric sensor element 20, in which a plurality of photosensitive components 22 are arranged on a carrier circuit board 23. The carrier circuit board 23 can be a flexible printed circuit board, for example. Further components 70 for processing the voltage generated by the photosensitive components when light is coupled in can be arranged on the carrier circuit board. Such components can be voltage transformers, for example. Furthermore, the components 70 can be control components for controlling the photosensitive components 22. By way of example, filters for the wavelength-selective reception of light can be positioned on the carrier circuit board 23. For example optical emitting components 24, such as laser diodes for example, can also be arranged on the carrier circuit board. The control of the optical emitting components can be performed by the control components 70. At bent sections of an optical transmission element, the light signals generated by the optical emitting components are coupled into the optical transmission element again.

In the embodiments shown in FIGS. 1 to 4, the optical transmission element can be an optical waveguide, for example an optical-waveguide fibre. The optical-waveguide fibre has a light-guiding core, composed of a material composed of glass or plastic, which is surrounded by a protective coating.

Figure 6:
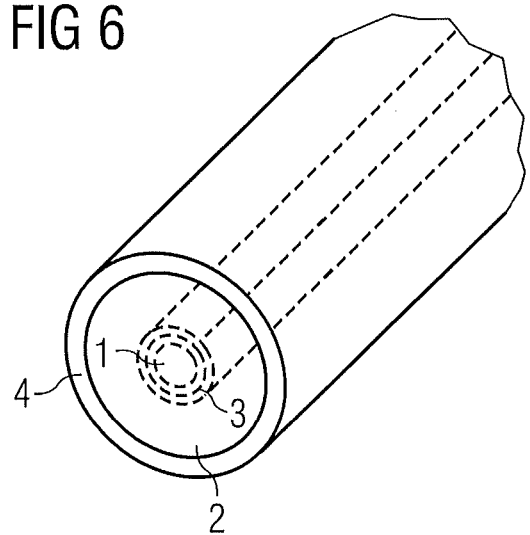
FIG. 6 shows an optical transmission element for guiding light for the transmission of data and for providing a power supply.

FIG. 6 shows a further embodiment of an optical transmission element, which can be used in the embodiments of the device for converting light into an electrical signal as shown in FIGS. 1 to 4. In the embodiment shown in FIG. 6, the optical transmission element is configured as a hybrid optical waveguide. The hybrid optical waveguide can be used for transmitting data and for transmitting a power supply. The optical waveguide 10 has an inner region 1, which is provided for transmitting data. The inner region is surrounded by an outer region 2, which is provided for transmitting light that can be coupled out from the optical waveguide 10 for providing a power supply at a bent section of the optical waveguide. The regions 1 and 2 can be produced from the same material, for example from glass or plastic.

In order that the light guiding of the light in the inner region 1 and the outer region 2 does not mutually influence one another, the material of the inner and outer regions of the optical waveguide can have a different refractive index. In a further embodiment of the optical waveguide, nanostructures 3 are arranged around the inner region 1. The nanostructures 3 can be air holes, for example, which are configured in tubular fashion along the optical waveguide between the inner region 1 and the outer region 2. A gas, for example air, can be contained in the tubular cavities. The nanostructures prevent light which is guided in the core region 1 from being able to emerge into the outer region 2, and conversely light which is guided in the outer material region 2 from being able to penetrate into the inner region 1. The optical waveguide 10 can be surrounded by a coating 4. For coupling out light which is transmitted in the outer region 2, the coating is transparent in the wavelength range of the transmitted light, or has a low absorption. In order to enable light to be coupled out from the outer region 2 at bent sections of the optical waveguide in a manner as free of losses as possible, the coating can be removed at the bent sections.

Figure 7:
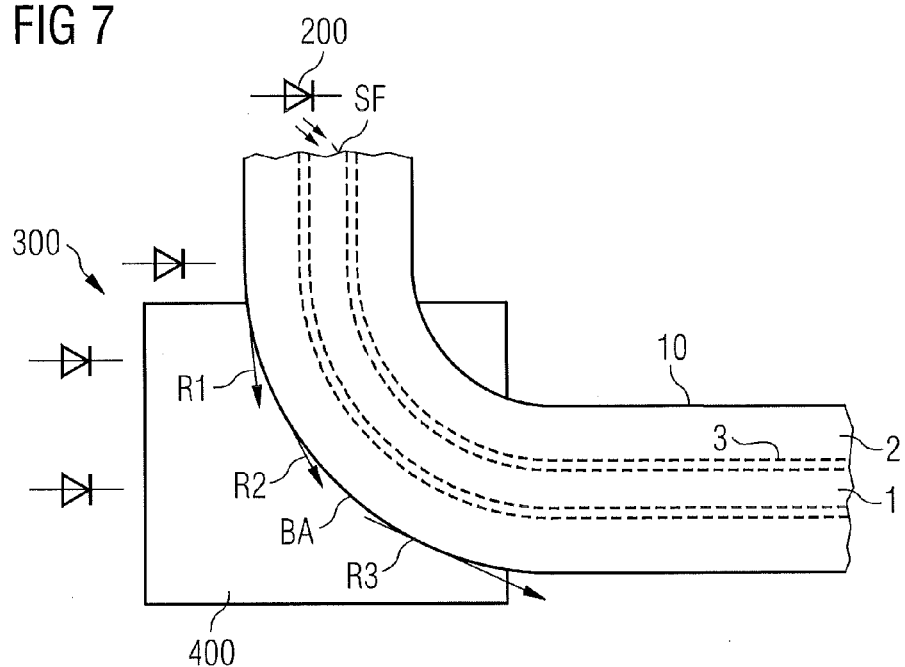
FIG. 7 shows a device for coupling light into an optical transmission element.

FIG. 7 shows the coupling-in of light at a bent section BA of an optical transmission element 10. The optical transmission element can be an optical waveguide configured in the embodiment shown in FIG. 6. An emitting unit 200, which can comprise a laser diode for example, couples light into the inner region 1 of the optical waveguide at an end face SF of the optical transmission element 10. As in the embodiment shown in FIG. 6, the inner region 1 of the optical waveguide is surrounded by a layer of nanostructures 3. This ensures that, at the bent section BA, the light is guided further in the inner region 1.

An emitting unit 300 is provided for coupling light into the outer region 2. The emitting unit 300 can comprise a multiplicity of laser diodes, for example, which radiate light in a tangential direction onto the bent section BA of the optical waveguide 10. The bent section BA of the optical waveguide 10 is surrounded by a coupling element 400, which is provided for coupling light into the optical waveguide. The coupling element 400 is formed from a material which is transparent to the light generated by the laser diodes 300 and has the same refractive index as the material of the optical transmission element 10. The emitting units 300 are arranged so that the light generated by them impinges tangentially on edge regions R1, R2 and R3 of the outer region 2. The material of the coupling element 400 and the arrangement of the emitting units 300 ensure that the light coupled out from the laser diodes 300 is coupled into the outer region 2 of the optical transmission element 10 at the bent section BA.

Figure 8:
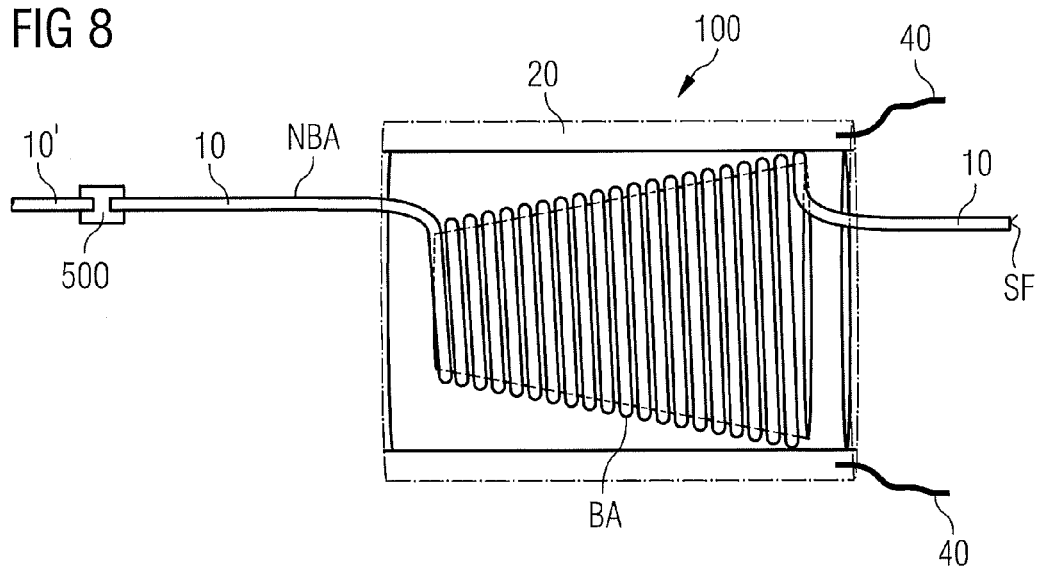
FIG. 8 shows an embodiment of a device for coupling out light from an optical transmission element.

FIG. 8 shows the coupling of an optical transmission element to a device 100 for converting light into an electrical signal, and also the coupling-out of light from an optical transmission element. The optical transmission element 10' has for example the embodiment of an optical waveguide as shown in FIG. 6. The optical waveguide 10' is connected to the device 100 for converting light into an electrical signal at a coupling location 500. The coupling location can be a plug connection, for example, by which the optical waveguide 10' is connected to the optical transmission element 10 of the device 100. The optical waveguide 10' can also be connected to the optical transmission element 10 of the device 100 by a splice connection 500. The optical transmission element 10 of the device 100 has for example the embodiment shown in FIG. 6. Via the coupling location, light which is guided in the inner region of the optical waveguide 10' is coupled into the inner region of the optical transmission element 10 and furthermore light which is guided in the optical waveguide 10' in the outer region is coupled into the outer region of the optical transmission element 10.

The device 100 can have one of the embodiments of the optical transmission element 10 as shown in FIGS. 1 to 4 and, respectively, one of the embodiments of the photoelectric sensor element 20 as shown in FIGS. 1 to 3B. By way of example, the device 100 is configured in the embodiment illustrated in FIG. 2B. The optical transmission element 10 has at a section BA a plurality of bends of the material which are surrounded by a photoelectric sensor element 20. Owing to the bent sections of the optical transmission element, light that has been coupled into the outer region of the optical transmission element 10 at the coupling location 500 is coupled out from the outer region of the optical transmission element and coupled into the photoelectric sensor element 20. At terminals 40 of the photoelectric sensor element, the level of an electrical signal, for example the level of a voltage, is generated in a manner dependent on the level of the light coupled in. The terminals 40 of the device 10 can be connected to a receiving unit, for example a video camera. For transmitting data to the receiving unit, the light coupled into the inner region 1 of the optical transmission element 10 is coupled out from the inner region of the optical transmission element at an end face SF.

If, as a receiving unit, a video camera is connected to the device 100, the light coupled out from the inner region of the optical transmission element 10 can be coupled into a photodiode of the video camera. For transmitting back information, the light coupled out at the end face SF can be modulated in the receiving unit and be coupled into the optical transmission element 10 again. For power supply purposes, the receiving unit is connected to the terminals 40. Through light transmission via the optical waveguide 10', a supply voltage for operating a receiving unit is thus provided at the device 100.

What is claimed is:

1. A device for converting light into an electrical signal, comprising:
   an optical transmission element for transmitting light; and
   a photoelectric sensor element for converting light into an electrical signal, wherein
   the optical transmission element has a bent section,
   the optical transmission element is configured so that light transmitted in the optical transmission element is coupled out from the optical transmission element at the bent section,
   the photoelectric sensor element is arranged so that the light coupled out from the optical transmission element is coupled into the photoelectric sensor element,
   the photoelectric sensor element is configured so that the electrical signal is generated when light is coupled into the photoelectric sensor element, and
   the photoelectric sensor element comprises a terminal for providing a voltage, wherein the photoelectric sensor element is configured so that when light is coupled into the photoelectric sensor element, at the terminal, a level of the voltage is provided that is dependent on a light intensity of the light coupled in.

2. The device of claim 1, wherein the bent section of the optical transmission element is bent helically.

3. The device of claim 1, wherein a plurality of layers composed of in each case the bent section of the optical transmission element and the photoelectric senor element are arranged one above another.

4. The device of claim 1, wherein light coupled out from the optical transmission element is coupled into the optical transmission element after a modulation.

5. The device of claim 1, further comprising a reflector configured such that light coupled out from the optical transmission element impinges on the reflector and is reflected onto the photoelectric sensor element.

6. The device of claim 5, wherein the optical transmission element has a further section wherein the bent section is arranged closer to the photoelectric sensor element than the further section, wherein the optical transmission element is configured so that more light is coupled out at the bent section than at the further section.

7. The device of claim 1, wherein the optical transmission element is arranged on a carrier element.

8. The device of claim 7, wherein the carrier element is configured in cylindrical or conical fashion.

9. The device of claim 8, wherein the carrier element has a diameter of between 6 mm and 15 mm.

10. The device of claim 7, wherein the carrier element contains a material comprising plastic, metal or PLEXIGLAS.

11. The device of claim 1, wherein the optical transmission element is at least partially embedded in a protective body.

12. The device of claim 11, wherein the optical transmission element is cast in a material of the protective body or encapsulated by the material of the protective body by injection-moulding.

13. The device of claim 11, wherein the protective body is transparent.

14. The device of claim 1, wherein the optical transmission element comprises an optical waveguide.

15. The device of claim 14, wherein the optical waveguide has an inner region and an outer region and a layer of nanostructures is arranged between the inner and outer regions.

16. The device of claim 14, wherein the optical waveguide has an inner region and an outer region and cavities containing a gas are arranged between the inner and outer regions.

17. The device of claim 14, wherein the optical waveguide has an inner region and an outer region and a material of the inner region and a material of the outer region in each case have different refractive indexes.

18. The device of claim 15, wherein the inner and outer regions contain a material comprising glass or plastic.

19. The device of claim 1, wherein the photoelectric sensor element is arranged circumferentially around the optical transmission element and comprises a flexible film having a light-sensitive material containing at least one of silicon and gallium arsenide.

20. The device of claim 1, wherein the photoelectric sensor element comprises a photodiode arranged on a printed circuit board.

21. The device of claim 20, wherein the printed circuit board comprises at least one light-emitting component.

* * * * *